United States Patent [19]

Josquin et al.

[11] Patent Number: 5,151,382
[45] Date of Patent: Sep. 29, 1992

[54] METHOD OF MANUFACTURING A SEMICONDUCTOR DEVICE BY MASKLESS PN JUNCTION ISOLATION MEANS

[75] Inventors: Wilhelmus J. M. J. Josquin, Eindhoven; Wilhelmus C. M. Peters, Nijmegen; Albertus T. M. Van De Goor, Eindhoven, all of Netherlands

[73] Assignee: U.S. Philips Corp., New York, N.Y.

[21] Appl. No.: 761,098

[22] Filed: Sep. 17, 1991

[30] Foreign Application Priority Data

Sep. 19, 1990 [GB] United Kingdom ............... 9020484

[51] Int. Cl.⁵ .......................................... H01L 21/76
[52] U.S. Cl. ...................................... 437/74; 437/28; 437/149; 148/DIG. 35
[58] Field of Search ...................... 437/26, 27, 28, 29, 437/30, 31, 33, 34, 74, 148, 149, 150; 148/DIG. 34, DIG. 35

[56] References Cited

U.S. PATENT DOCUMENTS

| 4,357,622 | 11/1982 | Magdo et al. | 437/27 |
| 4,780,425 | 10/1988 | Tabata | 437/149 |
| 4,892,837 | 1/1990 | Kudo | 437/33 |
| 5,010,026 | 4/1991 | Gomi | 437/26 |

FOREIGN PATENT DOCUMENTS 0140653  6/1989  Japan ..................................... 437/74

Primary Examiner—Brian E. Hearn
Assistant Examiner—C. Chaudhari
Attorney, Agent, or Firm—Steven R. Biren

[57] ABSTRACT

A semiconductor body (1) is provided having a first region (4) of one conductivity type adjacent one major surface (2). An insulating layer (5) is formed on the one major surface and masking means (6,7) are used to form over first and second areas (20 and 21) of the one major surface (2) windows (8,9,10) in the insulating layer (5) through which impurities are introduced to form a relatively highly doped region (11) of the opposite conductivity type adjacent the first area (20) and a relatively lowly doped region (12) of the opposite conductivity type adjacent the second area (21). The surface (5a) of the insulating layer (5) is exposed prior to introducing impurities of the one conductivity type for forming a region (13) within the relatively lowly doped region (12) of the opposite conductivity type and with a dose sufficient to form the region (13) but not sufficient to overdope the relatively highly doped region (11) so avoiding the need to mask the first area (20) during this step. The thickness of the insulating layer (5) is such that a proportion of the impurities of the one conductivity type penetrate the insulating layer (5) to increase the doping of a surface layer(40) of the first region (4) so as to reduce problems such as punch-through effects.

10 Claims, 3 Drawing Sheets

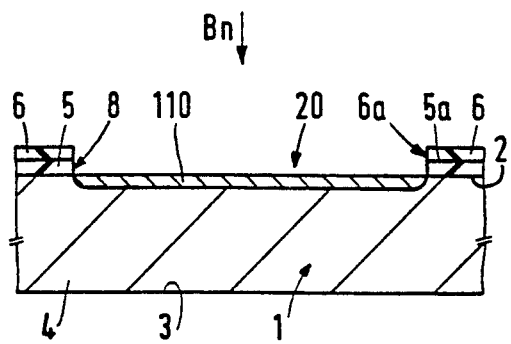
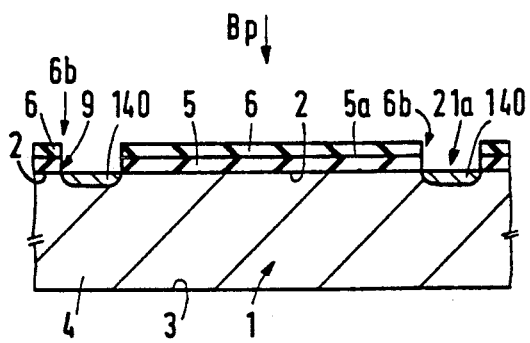
FIG.1a  FIG.1b
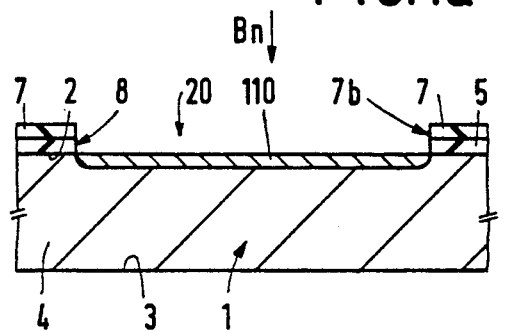
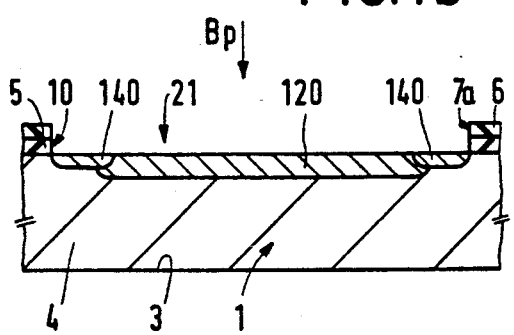
FIG.2a  FIG.2b
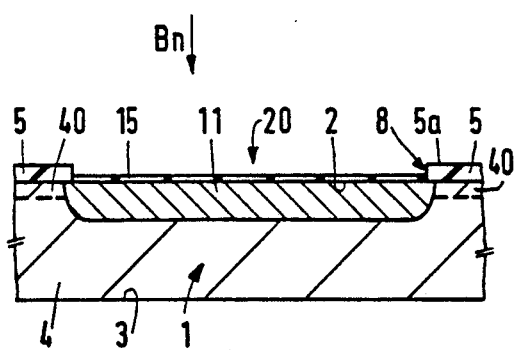
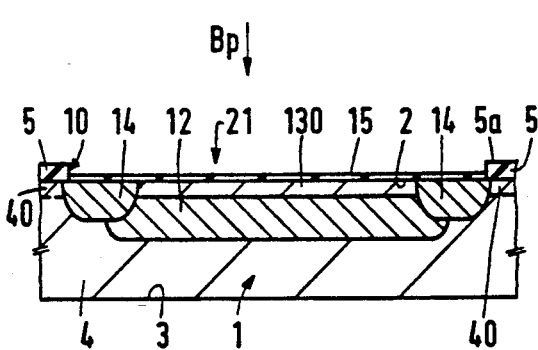
FIG.3a  FIG.3b
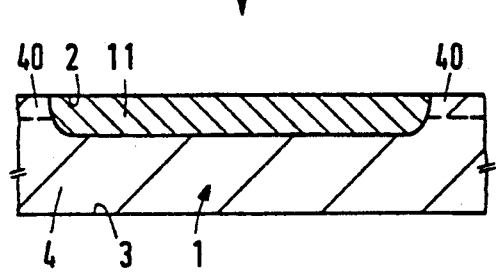
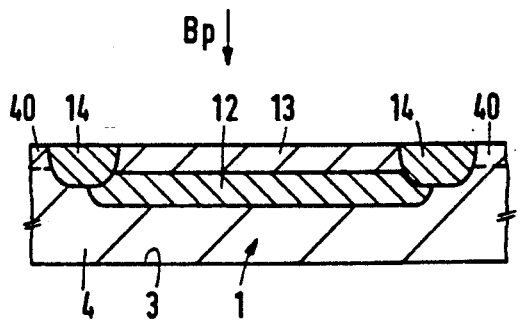
FIG.4a  FIG.4b

METHOD OF MANUFACTURING A SEMICONDUCTOR DEVICE BY MASKLESS PN JUNCTION ISOLATION MEANS

BACKGROUND OF THE INVENTION

This invention relates to a method of manufacturing a semiconductor device, which method comprises providing a semiconductor body having a first region of one conductivity type adjacent one major surface, providing an insulating layer on the one major surface, using masking means to form windows in the insulating layer over first and second areas of the one major surface, introducing impurities to form a relatively highly doped region of the opposite conductivity type adjacent the first area and a relatively lowly doped region of the opposite conductivity type adjacent the second area, and then introducing impurities of the one conductivity type for forming a region of the one conductivity type within the relatively lowly doped region of the opposite conductivity type.

Such a method is described in, for example, U.S. Pat. No. 4,485,552 which is concerned with the manufacture of complementary bipolar transistors within a single semiconductor body. As described in U.S. Pat. No. 4,485,552 the semiconductor body is a silicon body of one conductivity type, p conductivity type in the example, onto which the insulating layer is thermally grown as a silicon oxide layer of about 350 nm thickness. A first masking layer is used to define a window in the insulating layer over the second area into which, after formation of a thin protective oxide layer, phosphorus ions are implanted with a high energy and low dose for forming the relatively lowly doped region which will later form a barrier region for the pnp bipolar transistor.

A second masking layer is then used to define a window in the oxide layer over the first area and arsenic ions are then implanted to form, adjacent the first area, the relatively highly doped region of the opposite (n in this example) conductivity type which later serves as a buried part of the collector region of the npn bipolar transistor. A further thermal re-oxidation process is then carried out to close the window over the first area and a third masking layer is then used to enable windows to be opened for allowing the introduction of boron ions to form, as shown in FIG. 3 of U.S. Pat. No. 4,485,552, "cut-off" regions of the one conductivity type and at the same time to form through a window opened over the second area the region of the one conductivity type which later will form a buried part of the collector region of the pnp bipolar transistor. The insulating layer is then removed and a layer of, in the example described, epitaxial material of opposite conductivity type to the semiconductor body is grown on the one major surface. Recessed oxide isolation regions are then formed in the epitaxial layer to separate the areas of the respective bipolar transistors and further processing steps carried out to define an npn bipolar transistor at the first area and a pnp bipolar transistor at the second area.

Thus, in the method described in U.S. Pat. No. 4,485,552 three different implantation steps are carried out to form the buried parts of the collector regions of the complementary bipolar transistors and the isolation or barrier region for the pnp bipolar transistor and each of these implantation steps requires a separate masking layer to enable the necessary windows in the insulating layer to be opened.

SUMMARY OF THE INVENTION

It is an aim of the present invention to provide a method of manufacturing a semiconductor device which enables the manner in which the relatively highly doped and relatively lowly doped regions of the opposite conductivity type and the region of the one conductivity type are formed to be simplified and which, in particular, does not require the first area to be masked during the introduction of the impurities for forming the region of the one conductivity type.

According to the present invention, there is provided a method of manufacturing a semiconductor device, which method comprises providing a semiconductor body having a first region of one conductivity type adjacent one major surface, providing an insulating layer on the one major surface, using masking means to form windows in the insulating layer over first and second areas of the one major surface, introducing impurities to form a relatively highly doped region of the opposite conductivity type adjacent the first area and a relatively lowly doped region of the opposite conductivity type adjacent the second area, and introducing impurities of the one conductivity type for forming a region of the one conductivity type within the relatively lowly doped region of the opposite conductivity type, characterised by exposing the surface of the insulating layer prior to introducing the impurities of the one conductivity type and introducing the impurities of the one conductivity type through the windows in the insulating layer with a dose sufficient to form a region of the one conductivity type within the relatively lowly doped region of the opposite conductivity type but not within the relatively highly doped region of the opposite conductivity type, the thickness of the insulating layer being such that a proportion of the impurities of the one conductivity type penetrate the insulating layer to increase the doping of a surface layer of the first region adjacent the one major surface beneath the insulating layer.

Thus, using a method in accordance with the invention, the impurities for forming the region of the one conductivity type are introduced through the windows in the insulating layer with a dose sufficient to form the region of one conductivity type within the relatively lowly doped region of the opposite conductivity type but not sufficient to overdope the relatively highly doped region of the opposite conductivity type. This enables the impurities for forming the region of the one conductivity type to be introduced without having to mask or cover the first area. In addition, the thickness of the insulating layer is selected such that a proportion of the impurities of the one conductivity type penetrate the insulating layer to define beneath the insulating layer a surface layer of the first region which has a slightly higher dopant concentration than the remaining portion of the first region. The increased doping of the surface layer serves to provide good isolation between the regions of the opposite conductivity type so enabling problems such as punch-through between the regions of the opposite conductivity type to be avoided or at least inhibited without having to increase the overall doping of the first region which could lead to undesired increased capacitance effects.

In a preferred embodiment, the window over the first area is formed using a first masking layer, the impurities for forming the relatively highly doped region of the one conductivity type at the first area are introduced and the first masking layer then removed, the window over the second area is formed using a second masking layer, the impurities for forming the relatively lowly doped region of the opposite conductivity type adjacent the second area are introduced and then the second masking layer is removed prior to introducing the impurities for forming the region of the one conductivity type adjacent the second area.

A relatively highly doped annular region of the opposite conductivity type may be formed bounding the second area at the same time as the relatively highly doped region of the opposite conductivity type. In such a case the method may comprise using a first masking layer to form the window over the first area and an annular window surrounding the second area, introducing the impurities for forming the relatively highly doped region adjacent the first area and the relatively highly doped annular region bounding the second area and then removing the first masking layer, using a second masking layer to form the window over the second area, introducing the impurities for forming the relatively lowly doped region adjacent the second area, and then removing the second masking layer prior to introducing the impurities for forming the region of one conductivity type adjacent the second area.

Thus, the relatively highly doped and relatively lowly doped regions of the opposite conductivity type can be formed separately enabling, for example, different types of impurities to be used to form the relatively highly doped and the relatively lowly doped regions of the opposite conductivity type. For example, the relatively highly doped region may be formed using a relatively high dose of an impurity having a relatively low diffusion coefficient such as arsenic whilst the relatively lowly doped region may be formed using a relatively low dose of an impurity having a relatively high diffusion coefficient such as phosphorus. This enables the characteristics of the relatively highly doped and relatively lowly doped regions of the opposite conductivity type to be independently optimised. The first area may be exposed during the introduction of the impurities for forming the relatively lowly doped region. Of course, where desired or appropriate, the steps given above may be reversed so that the window over the second area is defined with the first masking layer and the impurities for forming the relatively lowly doped region of the opposite conductivity type introduced prior to those for forming the relatively highly doped region of the opposite conductivity type. In such a case, the second area should be masked by the second masking layer during the introduction of the impurities for forming the relatively highly doped region of the opposite conductivity type. No masking layer is required during the introduction of the impurities to form the region of the one conductivity type at the second area.

After the impurities have been introduced to define the region of the one conductivity type, the insulating layer may be removed and a layer of semiconductor material provided, for example by epitaxial growth, on the one major surface. The semiconductor material may be the same as the semiconductor body, for example both may be monocrystalline silicon, and may be of the same conductivity type as the first region.

Impurities may then be introduced into the semiconductor material layer to define at the first area a well region of the opposite conductivity type over and in contact with the relatively highly doped region of the opposite conductivity type and at the second area an annular region of the opposite conductivity type bounding a region of the semiconductor material layer which forms with the region of the one conductivity type a well region of the one conductivity type. Complementary conductivity type transistors may then be provided in the well regions. The complementary type transistors may be bipolar transistors. Where the first region is of p conductivity type then the npn transistor will be provided in the well region at the first area with the relatively highly doped region of the opposite conductivity type, n conductivity type in this example, providing a buried part of the collector region and the pnp transistor will be provided in the well region at the second area with the region of the one conductivity type forming a buried part of the collector region of the pnp transistor.

BRIEF DESCRIPTION OF THE DRAWINGS

Embodiments of the invention will now be described, by way of example, with reference to the accompanying drawings, in which:

FIGS. 1a, 1b, 2a, 2b, 3a, 3b, 4a and 4b are schematic cross-sectional views each of part of a semiconductor body for illustrating steps in a method in accordance with the invention;

DESCRIPTION OF THE INVENTION

Figure 5A:
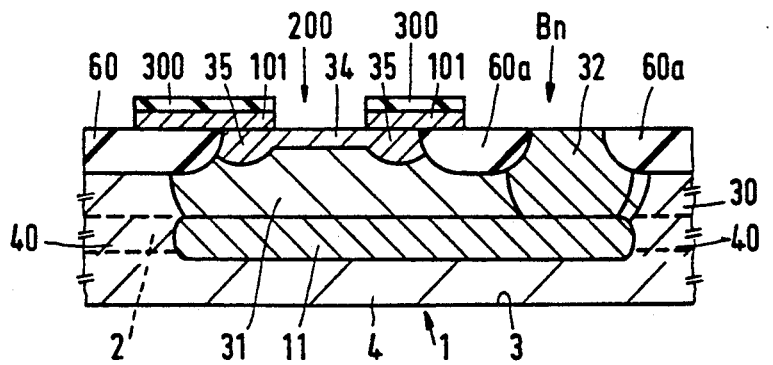
FIGS. 5a, 5b, 6a and 6b are schematic cross-sectional views each of part of a semiconductor body for illustrating the use of a method in accordance with the invention to manufacture a semiconductor device comprising complementary bipolar transistors.

It should be understood that the Figures are merely schematic and are not drawn to scale. In particular certain dimensions such as the thickness of layers or regions may have been exaggerated whilst other dimensions may have been reduced. It should also be understood that the same reference numerals are used throughout the Figures to indicate the same or similar parts.

Referring now to the drawings, in particular FIGS. 1a to 4b, there is illustrated a method of manufacturing a semiconductor device, which method comprises providing a semiconductor body 1 having a first region 4 of one conductivity type adjacent one major surface 2, providing an insulating layer 5 on the one major surface 2, using masking means 6, 7 to form windows 8, 9, 10 in the insulating layer 5 over first and second areas 20 and 21 of the one major surface 2, introducing impurities to form a relatively highly doped region 11 of the opposite conductivity type adjacent the first area 20 and a relatively lowly doped region 12 of the opposite conductivity type adjacent the second area 21, and then introducing impurities of the one conductivity type for forming a region 13 of the one conductivity type within the relatively lowly doped region 12 of the opposite conductivity type.

In accordance with the invention, the method further comprises exposing the surface 5a of the insulating layer 5 prior to introducing the impurities of the one conductivity type and introducing the impurities of the one conductivity type through the windows 8, 10 in the insulating layer 5 with a dose sufficient to form a region 13 of the one conductivity type within the relatively lowly doped region 12 of the opposite conductivity type but not within the relatively highly doped region 11 of the opposite conductivity type, the thickness of the insulating layer 5 being such that a proportion of the impurities of the one conductivity type penetrate the insulating layer 5 to increase the doping of a surface layer 40 of the first region 4 adjacent the one major surface 5 beneath the insulating layer 5.

Accordingly, using such a method the impurities for forming the region 13 of the one conductivity type are introduced through the windows 8, 10 in the insulating layer 5 with a dose sufficient to form the region 13 within the relatively lowly doped region 12 adjacent the second area 21 but not sufficient to overdope the relatively highly doped region 11 of the opposite conductivity type. Thus, the impurities for forming the region 13 can be introduced without having to mask or cover the first area 20. Also, the thickness of the insulating layer 5 is selected such that a proportion of the impurities of the one conductivity type penetrate the insulating layer 5 to define beneath the insulating layer 5 a surface layer 40 of the first region 4 which has a slightly higher dopant concentration than the remaining portion of the first region 4. The increased doping of the surface layer 40 serves to provide good isolation between the regions 11 and 12 of opposite conductivity type so enabling problems such as punch-through between the regions 11 and 12 of the opposite conductivity type to be avoided or at least inhibited without having to increase the overall doping of the first region 4 which could otherwise lead to undesirable increased capacitance effects.

An example of a method in accordance with the invention will now be described with reference to FIGS. 1a to 4b in which FIGS. 1a, 2a, 3a and 4a illustrate a part Bn of the semiconductor body 1 incorporating the first area 20 of the one major surface 2 and FIGS. 1b, 2b, 3b and 4b illustrate a part Bp of the semiconductor body 1 incorporating the second area 21 of the one major surface 2.

Referring now to the specific example illustrated in FIGS. 1a to 4b, the semiconductor body 1 comprises, in this particular case, a monocrystalline silicon body having first and second major surfaces 2 and 3. The semiconductor body 1 is of one conductivity type, p conductivity type in this example, and may have a resistivity in the region of, typically, 15 to 25 ohm-cm. In this example the first region 4 is formed by the semiconductor body 1.

The insulating layer 5 is provided on one major surface 2 of the semiconductor body 1 as a layer of silicon oxide which may be formed by any suitable conventional technique. Thus, for example, the insulating layer 5 may be a thermal oxide layer or may be deposited using conventional chemical vapour deposition (CVD) techniques. In this example, the insulating layer 5 has a thickness of about 150 nm (nanometres).

A first masking layer 6, in this example a layer of a conventional photosensitive resist, is provided on the surface 5a of the insulating layer 5 and is patterned using conventional photolithographic techniques to define first and second mask windows 6a and 6b. The insulating layer 5 is then etched using a conventional wet etching process through the mask windows 6a and 6b to define a first window 8 (FIG. 1a) exposing the first area 20 of the one major surface 2 and a second annular window 9 (FIG. 1b) exposing an annular area 21a bounding the second area 21 of the one major surface 2.

Impurities of the opposite conductivity type, n conductivity type in this case, are then introduced through the windows 8 and 9. In this example, arsenic ions (As$^+$) are implanted using a dose of $3 \times 10^{15}$ atoms cm$^{-2}$ and an energy of 100keV (Kilo electron volts).

As shown in FIGS. 1a and 1b, respectively, the implanted arsenic ions form precursor regions 110 and 140 which will eventually form the relatively highly doped region 11 and a relatively highly doped annular region 14. The first masking layer 6 serves to prevent the arsenic ions from being implanted into the insulating layer 5 from which they could diffuse into the semiconductor body 1 during subsequent processing.

The first masking layer 6 is then removed using conventional techniques and a second masking layer 7 provided. The second masking layer 7 may again be a conventional photosensitive resist layer which is patterned using conventional techniques to define a mask window 7a over the second area 21. In this example, a mask window 7b is also defined over the first area, although the first area 20 could remain covered by the second masking layer 7. If desired, for example if the presence of a photosensitive resist material on the bare silicon surface areas 20 and 21a is undesirable, a thin thermal oxide layer (not shown) may be grown after the arsenic implantation and before the second masking layer 7 is applied.

The portion of the insulating layer 5 over the second area (and any exposed thermal oxide) is then removed using a conventional wet etching process so as, as shown in FIG. 2b, to define the window 10 over the second area 21. As shown in FIG. 2a the window 8 over the first area 20 is also exposed.

Impurities of the opposite conductivity type are then introduced to define beneath the window 10 at the second area 21 a precursor region 120 (FIG. 2b) which will later form the relatively lowly doped region 12 of the opposite conductivity type. In this example phosphorus ions (p$^+$) with a dose of $1.5 \times 10^{13}$ atoms cm$^{-2}$ at an energy of 100keV are implanted to define the precursor region 120. As, in this example, the window 8 is also exposed, phosphorus ions are also implanted into the first area 20.

The second mask layer 7 is then removed and the semiconductor body 1 subjected to a pre-annealing treatment, for example in a nitrogen atmosphere and at 1000° C. (degrees Celsius), to anneal any implantation damage. An oxidation treatment is then carried out to define a thin thermal oxide layer 15 (FIGS. 3a and 3b) over the exposed silicon areas 20 and 21 so as to protect the silicon surface during a subsequent heat treatment, typically 1 hour at 1200° C., to drive-in the implanted impurities to form the relatively highly doped region 11, the relatively lowly doped region 12 and the annular region 14 as shown in FIGS. 3a and 3b. As illustrated in FIG. 3b because of the higher diffusion rate of phosphorus ions in the first region 4 the relatively lowly doped region 12 extends to a greater depth into the semiconductor body 1 than the relatively highly arsenic doped region 14.

After the drive-in heat treatment, impurities of the one conductivity type are introduced into the semiconductor body 1 using only the insulating layer 5 as a mask. In this example, boron ions (B$^+$) are implanted into the semiconductor body 1 via the insulating layer 5 to define within the relatively lowly doped region 11 a region 13 of the one conductivity type, p conductivity type in this example. The dose and energy of the boron implantation is sufficient to overdope the relatively lowly doped region 12 to define the region 13 but is not sufficient to overdope the relatively highly doped region 11 which thus remains n conductivity type. The thickness of the insulating layer 5 and the energy of the boron ion implantation are selected such that a proportion of the boron ions penetrate the insulating layer 5 to define a more highly p conductivity surface layer 40 (shown separated from the remainder of the first region by a dashed line in FIGS. 3a to 4b) of the first region 5 beneath the insulating layer 5. In this example, the insulating layer 5 has a thickness of about 150 nm whilst the boron implantation uses a dose of $3 \times 10^{13}$ atoms cm$^{-2}$ at an energy of 25keV. Thus, only the tail, roughly 10% of the total dose, of the boron ion implantation penetrates the insulating layer 5, resulting in this example in a maximum concentration beneath the insulating layer 5 of about $1 \times 10^{16}$ to $2 \times 10^{16}$ atoms cm$^{-3}$. The semiconductor body 1 is then subjected to a heat treatment to drive-in the introduced impurities so as to define the region 13 of the one conductivity type. The boron ions which were implanted into the relatively highly n doped regions 11 and 14 are held there by the high arsenic ion concentration and play no further part in the manufacturing process.

After this drive-in treatment, the insulating layer 5 and any other oxide is removed from the one major surface 2 so producing the structures shown in FIG. 4a and 4b. The structures shown in FIGS. 4a and 4b may be used in any suitable further manufacturing process. In this example to be described below, the regions 11,12,13 and 14 defined by the method described above are subsequently buried by a layer of semiconductor material and, in the case of the regions 11,12 and 14, define well or barrier regions for isolating devices to be defined within the semiconductor body 1.

FIGS. 5a to 6b illustrates further processing steps where the structures shown in FIGS. 4a and 4b are used in a complementary bipolar technology. Thus, in this example, the relatively highly doped region 11 of the opposite conductivity type, n conductivity type in this example, provides a buried part of the collector region of an npn bipolar transistor N whilst the regions 12 and 14 define isolation for a pnp transistor P for which the region of the one conductivity type 13 defines a buried part of the collector region.

Figure 5B:
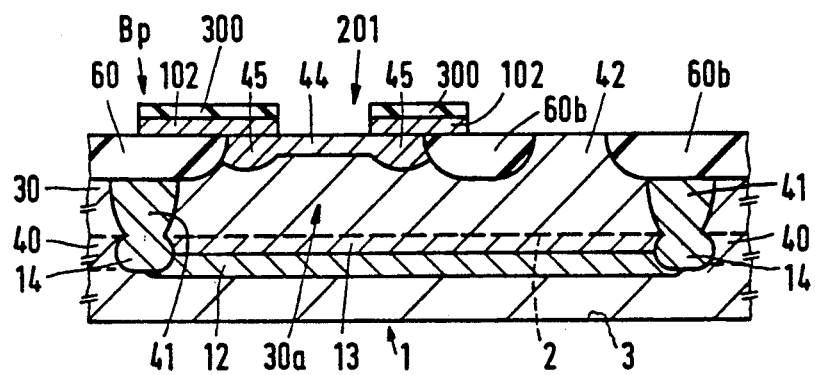

In this example after removal of the insulating layer 5, a layer 30 of p conductivity type silicon is grown on the one major surface 2 by conventional epitaxial techniques as shown in FIGS. 5a and 5b.

The surface of the epitaxial layer 30 provides a first device area 200, over the first area 20, at which the npn bipolar transistor N is formed and a second device area 201, over the second area 21, at which the pnp bipolar transistor P is formed.

The respective device areas 200 and 201 and any other device areas (not shown) are defined or separated from one another by forming a field oxide pattern 60 using, for example, conventional local oxidation of silicon techniques with a silicon oxide-silicon nitride mask (not shown). Various threshold adjustment implantations may be carried out if necessary for the IGFETs. Also, although not shown, highly doped channel stopper regions may be provided beneath the field oxide pattern 60 by ion implantation before formation of the field oxide pattern 60.

Impurities are introduced into the epitaxial layer 30 to define over the first area 20 a relatively lowly doped n conductivity type well region 31 (FIG. 5a) which together with the buried region 11 defines the collector region of the npn bipolar transistor N. At the same time, a relatively highly doped n conductivity type annular region 41 is defined over the annular area 21a of the one major surface 2 so as to contact the relatively highly doped annular region 14 thereby completing the isolation surrounding the collector region of the pnp bipolar transistor P which is defined by the region 13 and a portion 30a of the epitaxial layer bounded by the relatively highly doped region 41.

As is evident from FIG. 5a, in addition to defining the device areas 200 and 201, areas 60a of the field oxide pattern serve to define at the area 200 a collector contact area 32 which is doped twice with impurities of the one conductivity type, once during formation of the lowly doped collector region 31 and once through an appropriate mask, to enable ohmic contact to the collector region. Areas 60b of the field oxide pattern similarly define at the area 201 a collector contact area 42 for the pnp transistor P.

Polycrystalline silicon is then deposited using conventional chemical vapour deposition (CVD) techniques to a thickness of about 500 nm (nanometers). A masking layer (not shown) is then provided over the deposited polycrystalline silicon layer to mask the area 200 and n conductivity type impurities, in this example phosphorus ions, with, typically, an energy of 50keV and dose of $2 \times 10^{16}$ atoms cm$^{-2}$ are implanted through the mask to provide n conductivity type polycrystalline silicon at the area 201 for forming, as will become evident below, the extrinsic base region 45 of the pnp bipolar transistor P. The masking layer is then removed and p conductivity type impurities, in this example boron ions with an energy of 30keV and a dose of $3 \times 10^{15}$ cm$^{-2}$, implanted to cause the previously undoped polycrystalline silicon to become p conductivity type to provide at the area 200 p conductivity type polycrystalline silicon for forming the extrinisic base region of the npn bipolar transistor Bn. The dose used is insufficient to overdope the n conductivity type polycrystalline silicon which thus remains n type.

A layer of silicon oxide, for example TEOS (tetraethylorthosilicate), is then deposited to a thickness of about 300 nm on the polycrystalline silicon layer and the silicon oxide layer and underlying polycrystalline silicon are then etched, via an appropriate mask and using conventional techniques, to define doped polycrystalline silicon regions 101 and 102 at the areas 200 and 201, respectively, and a covering capping oxide layer 300 as shown in FIGS. 5a and 5b.

The area 200 is then masked and impurities of the one conductivity type, n conductivity type in this example, introduced using the doped polycrystalline silicon region 102, capping oxide layer 300 and field oxide pattern 60 as a mask to define the intrinsic base region 44 of the pnp bipolar transistor P. After removal of this mask, the area 201 is masked and p conductivity type impurities introduced to form the intrinsic base region 34 of the npn bipolar transistor N. During a subsequent annealing treatment, impurities are caused to diffuse out of the doped polycrystalline silicon regions 101 and 102 into the underlying silicon to form the extrinsic base regions 35 and 45 of the bipolar transistors N and P as shown in FIGS. 5a and 5b.

Figure 6A:
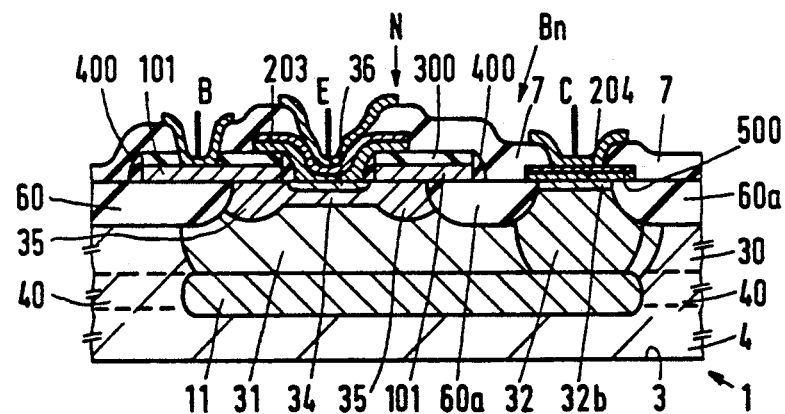
Figure 6B:
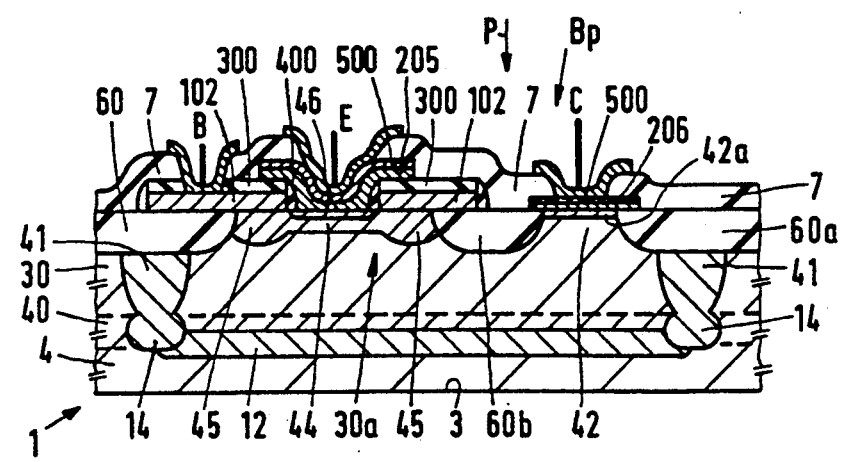

A further layer of silicon oxide, again in this example a TEOS layer, is then deposited over the surface structure and etched anisotropically using conventional techniques to leave, as shown in FIGS. 6a and 6b, insulating spacer regions 400 on the side walls of the doped polycrystalline silicon regions 101 and 102.

A second layer of polycrystalline silicon is then deposited and patterned using conventional photolithographic and etching techniques. A masking layer is then provided to cover the area 201 and n conductivity impurities introduced using the masking layer (not shown), field oxide pattern 60 and capping oxide regions 300 as a mask so as to form highly n conductivity type doped polycrystalline silicon regions 203 and 204 within the emitter window and over the collector contact area 32, respectively, at the area 200. This masking layer is then removed and replaced by another masking layer which masks the area 200 from p conductivity type impurities which are then introduced to form p conductivity type doped polycrystalline silicon regions 205 and 206 in the emitter window and over the collector contact area 42, respectively, at the area 201.

After removal of this masking layer, a siliciding metal, for example titanium, may be deposited to a thickness of about 30 nm, for example using conventional sputtering techniques, and is subjected to a rapid thermal anneal (RTA) to form a titanium silicide surface region 500 on the second doped polycrystalline silicon regions 203 to 205. The unreacted titanium is selectively removed from the oxide regions.

An insulating layer 7 is then provided over the surface structure. The insulating layer 7 may again be a TEOS layer. The insulating layer 7 is planarised using known techniques, for example by applying a flowable medium such as a resist or a glass (e.g. Borophosphosilicate glass (BPSG)) and then etching the insulating layers with an etchant which etches the TEOS layer 7 at the same rate as the resist or BPSG layer.

The emitter regions 36 and 46 and highly doped collector contact regions 32b and 42a of the bipolar transistors N and P are formed by diffusion of impurities out of the doped polycrystalline silicon regions 203, 204, 205 and 206. Generally, this diffusion is caused by a dedicated high temperature processing step prior to the silicidation step mentioned above, although, of course, additional diffusion of impurities out of the doped polycrystalline silicon regions may occur during the silicidation and possibly also during the planarisation process discussed above.

A contact window mask (not shown) is then provided on the planarised insulating layer 7 and contact windows opened to enable electrical connection by subsequent metallisation to form emitter E, base B and collector C contacts for the bipolar transistors. Thus, using a method in accordance with the invention enables three different buried layers or regions formed using different dopants to be provided using only two masks. In the example illustrated with reference to FIGS. 5a to 6b, the buried regions provide portions 11 and 13 of the collector regions of complementary bipolar transistors N and P and a portion 12 of the pn junction isolation for one of the bipolar transistors P.

In the example described the n conductivity type regions 11 and 12 are formed by implantation of, respectively, arsenic and phosphorus ions whilst the p conductivity type region is formed by implantation of boron ions.

Using the method described enables the boron ions to be introduced without a mask and in such a way that the portion 13 of the collector region of the pnp bipolar transistor Bp is created above the phosphorus doped region 12, boron ions enter the arsenic doped region 11 but without adverse results because the heavy doping of the region 11 holds the boron in place, and outside the regions 11 and 12 doped with arsenic and phosphorus, the insulating layer 5 has such a thickness that only the tail (normally about 10% of the total dose) of the boron implantation penetrates the insulating layer 5 to cause a slight increase in the boron doping between the n conductivity type regions, that is to result in the surface layer 40 of increased dopant concentration. This surface layer 40 allows for good isolation (i.e. it reduces the possibility of punch-through and other undesired effects) whilst not substantially increasing the capacitance of the substrate formed by the first region 4 of the semiconductor body.

It should be appreciated that the method described above with reference to FIGS. 5a to 6b is only one example of a way in which the structures shown in FIGS. 4a and 4b and manufactured using a method in accordance with the invention may be used to form complementary bipolar transistors and that other suitable methods may be used to provide complementary bipolar transistors using the structures shown in FIGS. 4a and 4b for forming the respective transistor well regions. The actual detailed collector, base and emitter structures may of course be different. Thus, although the example described shows double polycrystalline silicon bipolar transistors other types of bipolar transistors could be formed.

It will be appreciated by those skilled in the art that the regions 11, 12 and 13 provided, as shown in FIGS. 4a and 4b, using a method in accordance with the invention may be used, for example, as buried regions in other device structures. Thus, for example, the structures shown in FIGS. 4a and 4b may be used in forming well regions in CMOS (complementary MOS) semiconductor devices.

Figure 7A:
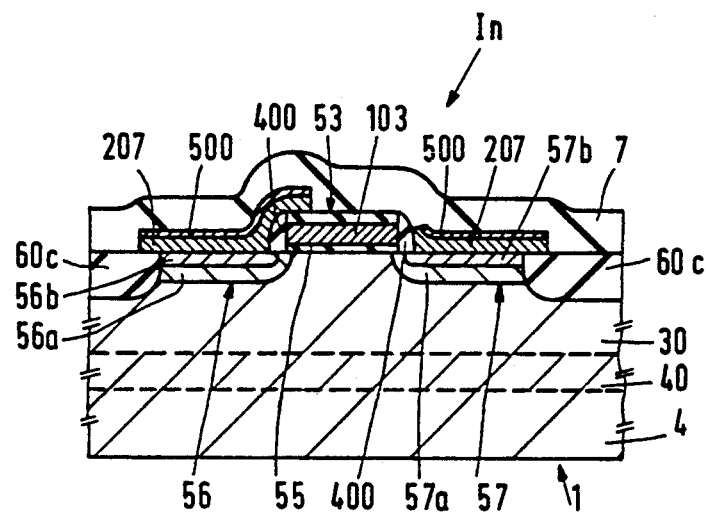
FIGS. 7a and 7b are schematic cross-sectional views each of part of a semiconductor body for illustrating a semiconductor device comprising complementary insulated gate field effect (CMOS) transistors which may be manufactured using a method in accordance with the invention.
Figure 7B:
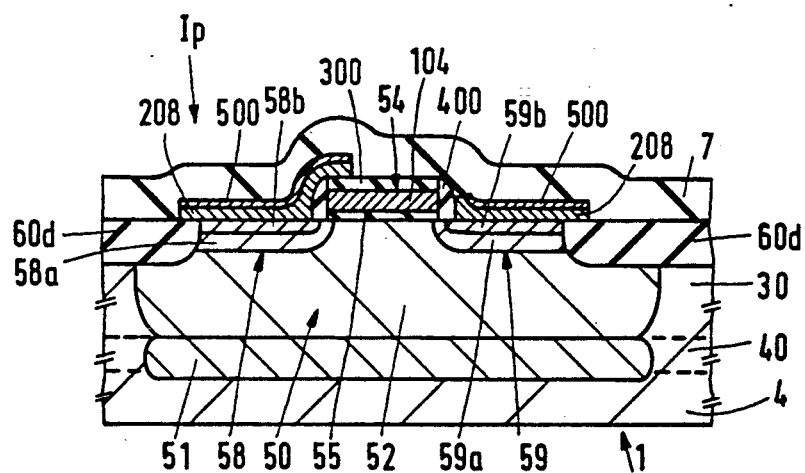

In addition the present invention may be applied to so-called BIGMOS devices in which bipolar devices are formed together with CMOS devices. FIGS. 7a and 7b illustrate, respectively, n and p channel MOSFETs (IGFETs) In and Ip which may be formed using a method in accordance with the invention in a process in which the bipolar transistors N and P shown in FIGS. 6a and 6b are also formed.

Thus, as shown in FIG. 7b, the p channel IGFET Ip is provided within a well region 50 similar to that used for the collector region of the npn bipolar transistor N (FIG. 6a) and accordingly, with appropriate mask modification, a relatively highly doped buried region 51 of the well region 50 may be formed with the region 11 whilst a less highly doped region 52 of the well region 50 may be formed with the region 31 of the collector of the bipolar transistor Bn.

The device areas of the MOSFETs Ip and In are, of course, bounded by regions 60c and 60d of the field oxide pattern 60. A thin-thermal oxide is provided to define the gate insulating regions 55 and conductive regions 103 and 104 of the insulated gates 53 and 54 are provided, by appropriate mask modification, from the same doped polycrystalline silicon layer as that used to form the doped polycrystalline silicon regions 101 and 102 for forming the extrinsic base regions of the bipolar transistors N and P (see FIGS. 6a and 6b). Generally, both conductive gate regions 103 and 104 will be of n conductivity type.

Lowly doped subsidiary region 56a, 57a, 58a and 59a of the source and drain regions 56, 57, 58 and 59 of the IGFETs are each formed with the respective intrinsic base region 34 or 44 of the appropriate conductivity type whilst relatively highly doped subsidiary regions 56b, 57b, 58b and 59b of the source and drain regions 56, 57, 58 and 59 are formed by diffusion of impurities out of appropriately doped polycrystalline silicon regions 207 and 208 provided with the polycrystalline silicon regions 203, 204, 205 and 206 which provide the emitter regions 36 and 46 and collector contact regions 32a and 42a of the bipolar transistors N and P (see FIGS. 6a and 6b).

It will of course be appreciated that a method in accordance with the invention may be applied where the conductivity types given above are reversed and may also be applied to semiconductor materials other than silicon, for example III-V materials such as gallium arsenide.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device, which method comprises providing a semiconductor body having a first region of one conductivity type adjacent one major surface, providing an insulating layer on the one major surface, using masking means to form windows in the insulating layer over first and second areas of the one major surface, introducing impurities to form a relatively highly doped region of the opposite conductivity type adjacent the first area and a relatively lowly doped region of the opposite conductivity type adjacent the second area, and introducing impurities of the one conductivity type for forming a region of the one conductivity type within the relatively lowly doped region of the opposite conductivity type, characterised by exposing the surface of the insulating layer prior to introducing the impurities of the one conductivity type and introducing the impurities of the one conductivity type through the windows in the insulating layer with a dose sufficient to form a region of the one conductivity type within the relatively lowly doped region of the opposite conductivity type but not within the relatively highly doped region of the opposite conductivity type, the thickness of the insulating layer being such that a proportion of the impurities of the one conductivity type penetrate the insulating layer to increase the doping of a surface layer of the first region adjacent the one major surface beneath the insulating layer.

2. A method according to claim 1, further characterised by forming the window over the first area using a first masking layer, introducing the impurities for forming the relatively highly doped region of the one conductivity type at the first area and then removing the first masking layer, forming the window over the second area using a second masking layer, introducing the impurities for forming the relatively lowly doped region of the opposite conductivity type adjacent the second area and then removing the second masking layer prior to introducing the impurities for forming the region of the one conductivity type adjacent the second area.

3. A method according to claim 1, further characterised by forming a relatively highly doped annular region of the opposite conductivity type bounding the second area at the same time as the relatively highly doped region of the opposite conductivity type.

4. A method according to claim 3, further characterised by using a first masking layer to form the window over the first area and an annular window surrounding the second area, introducing the impurities for forming the relatively highly doped region adjacent the first area and the relatively highly doped annular region bounding the second area and then removing the first masking layer, using a second masking layer to form the window over the second area, introducing the impurities for forming the relatively lowly doped region adjacent the second area and then removing the second masking layer prior to introducing the impurities for forming the region of one conductivity type adjacent the second area.

5. A method according to claim 2, further characterised by providing the second masking layer so as to expose the window already formed in the insulating layer over the first area.

6. A method according to claim 1, further characterised by removing the insulating layer after introducing the impurities to define the region of the one conductivity type and then providing a layer of semiconductor material of the one conductivity type on the one major surface.

7. A method according to claim 6, further characterised by introducing impurities into the semiconductor material layer to define at the first area a well region of the opposite conductivity type over and in contact with the relatively highly doped region of the opposite conductivity type and at the second area an annular region of the opposite conductivity type bounding a region of the semiconductor material layer which forms with the region of the one conductivity type a well region of the one conductivity type.

8. A method according to claim 7, further characterised by forming complementary conductivity type transistors in the well regions.

9. A method according to claim 8, further characterised by forming npn and pnp bipolar transistors in respective ones of the well regions.

10. A semiconductor device manufactured using a method in accordance with claim 1.

* * * * *